US006791077B1

(12) United States Patent
Farnsworth

(10) Patent No.: US 6,791,077 B1
(45) Date of Patent: Sep. 14, 2004

(54) MASS ANALYZER ALLOWING PARALLEL PROCESSING ONE OR MORE ANALYTES

(75) Inventor: Vincent R. Farnsworth, Fullerton, CA (US)

(73) Assignee: Beckman Coulter, Inc., Fullerton, CA (US)

( * ) Notice: Subject to any disclaimer, the term of this patent is extended or adjusted under 35 U.S.C. 154(b) by 0 days.

(21) Appl. No.: 10/643,591

(22) Filed: Aug. 19, 2003

Related U.S. Application Data

(63) Continuation-in-part of application No. 10/249,320, filed on Mar. 31, 2003.

(51) Int. Cl.[7] .................................................. H01J 37/05

(52) U.S. Cl. ........................ 250/285; 250/281; 250/295; 250/293; 250/283; 250/397

(58) Field of Search ................................. 250/285, 281, 250/293, 295, 283, 397

(56) References Cited

U.S. PATENT DOCUMENTS 3,796,872 A * 3/1974 Merren ........................ 250/283
3,886,357 A * 5/1975 Naito .......................... 250/285
4,126,804 A 11/1978 Asam et al.
4,208,582 A 6/1980 Arnush et al.
5,514,868 A 5/1996 Dixon
6,153,880 A 11/2000 Russ, IV et al.
6,410,914 B1 6/2002 Park et al.
6,521,887 B1 2/2003 Funsten et al.
6,545,268 B1 4/2003 Verentchikov et al.
2003/0201387 A1 * 10/2003 Hartley et al. .............. 250/281

* cited by examiner

*Primary Examiner*—Nikita Wells
(74) *Attorney, Agent, or Firm*—William H. May; D. David Hill; Robert B. Polit

(57) ABSTRACT

An improved mass analyzer capable of parallel processing one or more analytes is set fourth. The mass analyzer comprises a mass filter unit having a plurality of ion selection chambers disposed in parallel with one another. Each of the plurality of ion selection chambers respectively includes an ion inlet lying in an inlet plane and an ion outlet lying in an outlet plane. The mass analyzer further includes a plurality of electrodes disposed in the ion selection chambers and at least one RF signal generator connected to the plurality of electrodes to produce a non-rotating, oscillating electric field in each ion selection chambers. A plurality of ion injectors are each coupled to inject an ion beam into the ion inlet of a respective ion selection chambers. The ions meeting predetermined m/Q requirements pass through the ion selection chambers to contact corresponding detection surfaces of an ion detector array. The mass filter array may also be constructed so that at least one pair of ion selection chambers share at least one common field generating electrode.

47 Claims, 9 Drawing Sheets

FIG. 6A
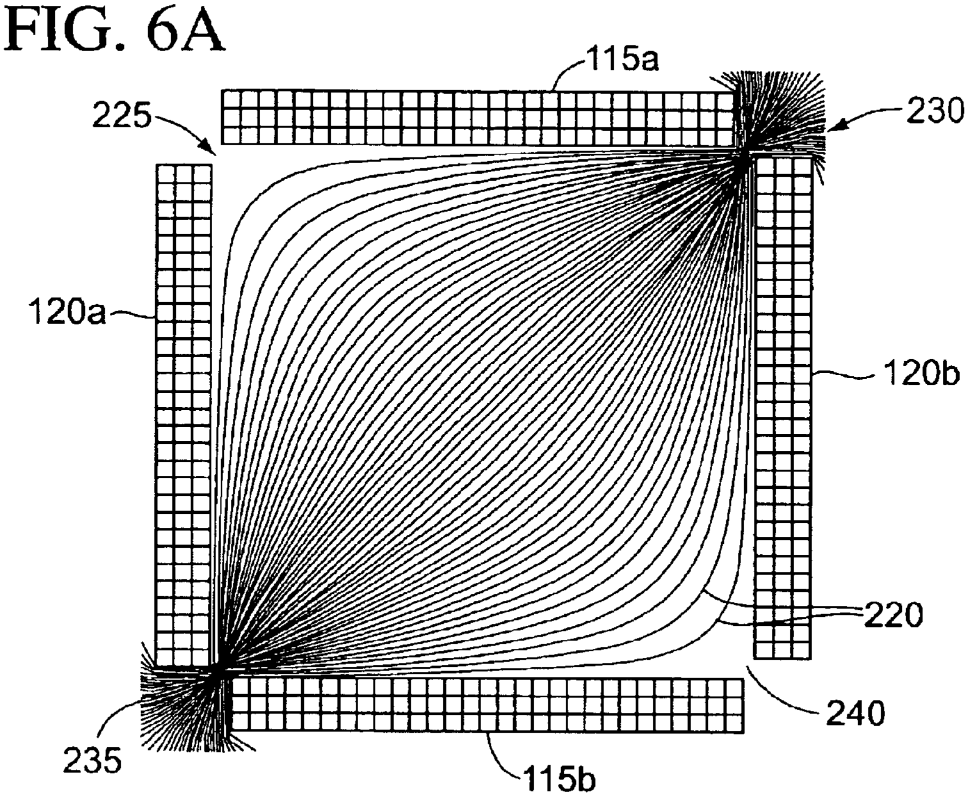
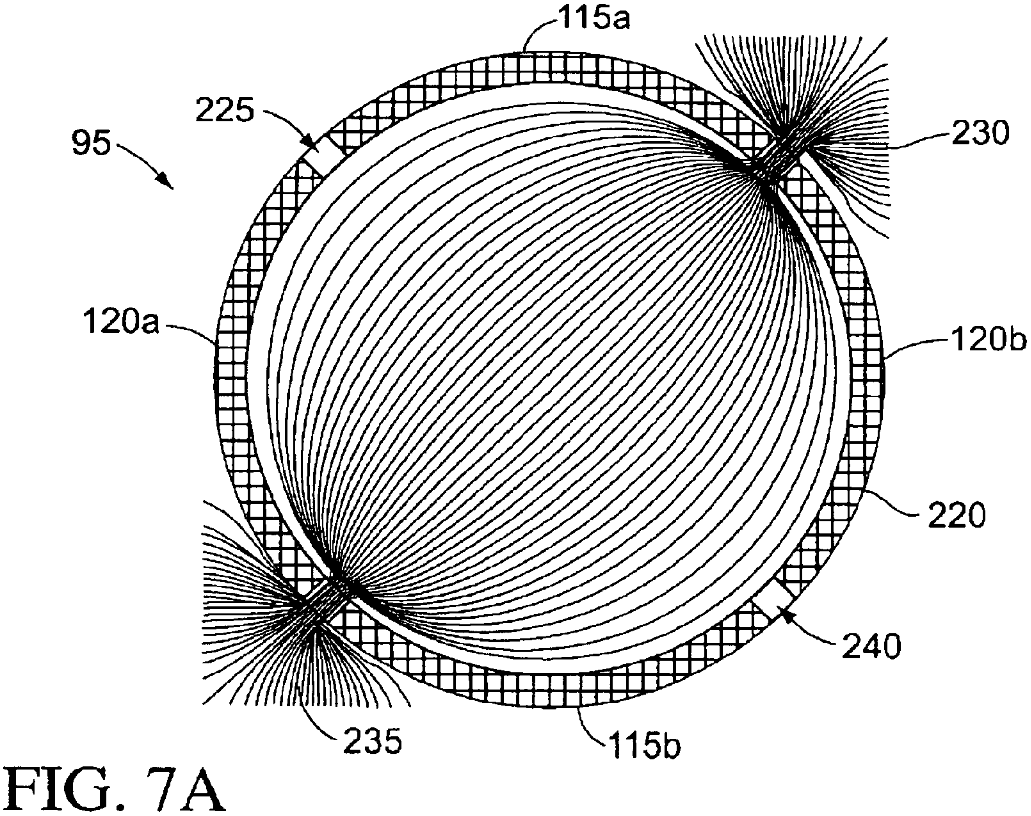
FIG. 7A

FIG. 6B
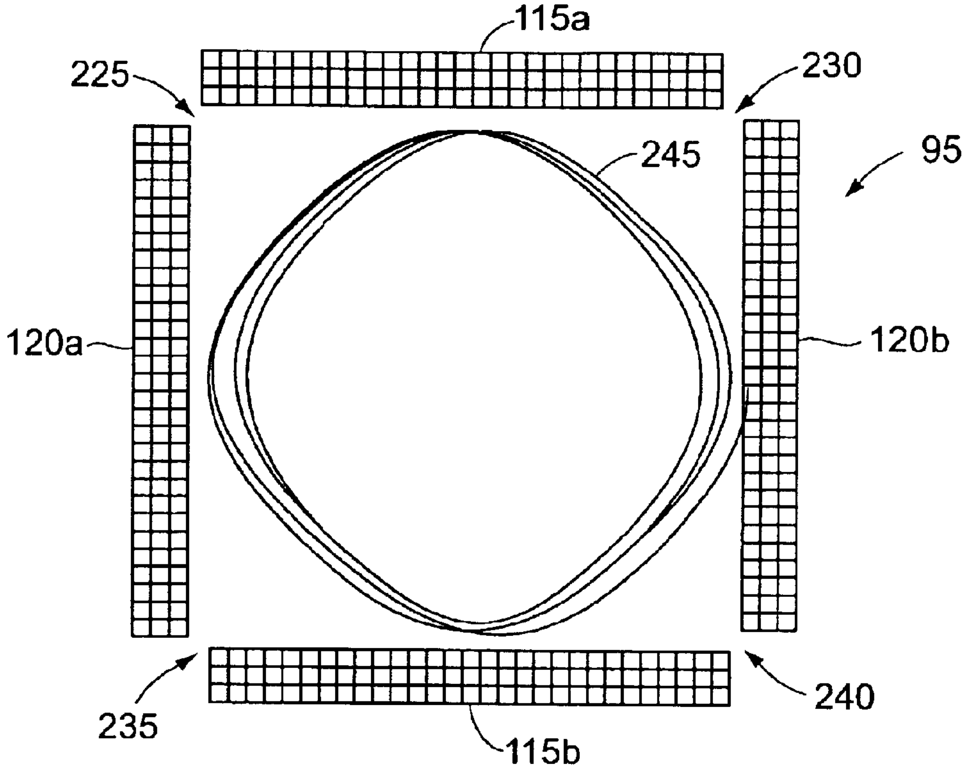
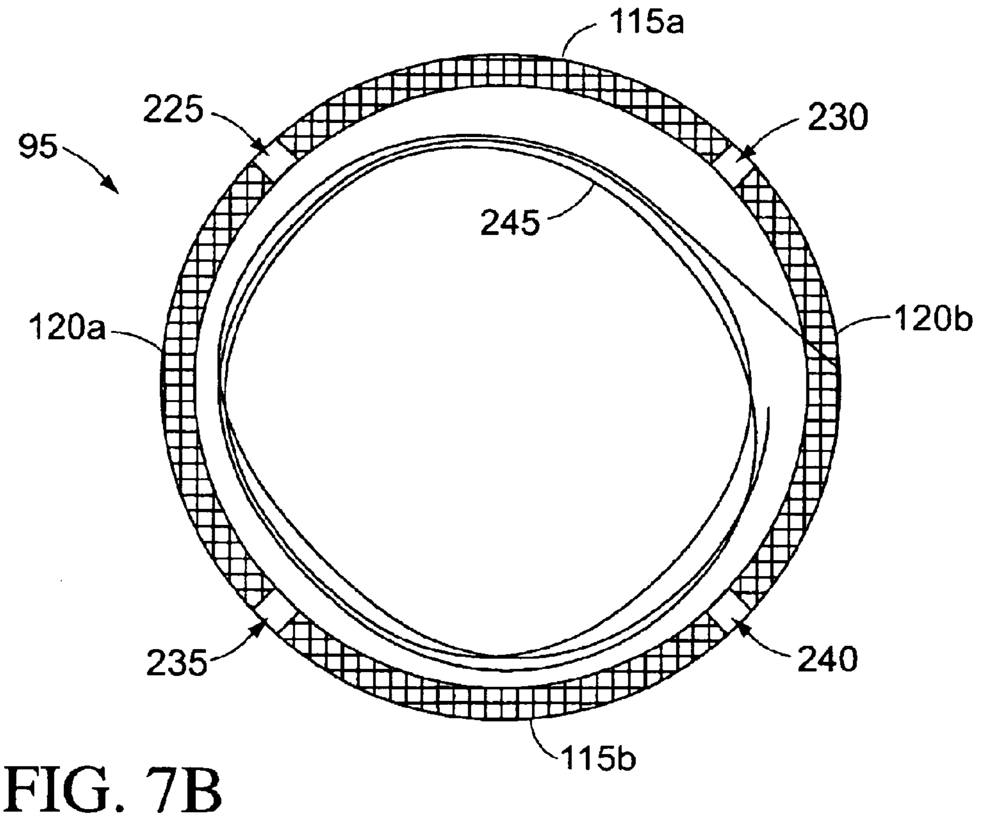
FIG. 7B

MASS ANALYZER ALLOWING PARALLEL PROCESSING ONE OR MORE ANALYTES

CROSS-REFERENCE TO RELATED APPLICATIONS

This application is a continuation-in-part application of U.S. Ser. No. 10/249,320, filed Mar. 31, 2003, entitled "MASS ANALYZER CAPABLE OF PARALLEL PROCESSING ONE OR MORE ANALYTES".

FIELD OF THE INVENTION

The present invention is generally directed to mass analyzers. More particularly, the present invention is directed to a mass analyzer that facilitates parallel processing of one or more analytes. In accordance with further aspects of the present invention, various mass filter chamber arrangements that use non-planar electrodes to generate the electric field in a given chamber are also set forth.

BACKGROUND OF THE INVENTION

The characteristics of mass spectrometry have raised it to an outstanding position among the various analysis methods. It has excellent sensitivity and detection limits and may be used in a wide variety of applications, e.g. atomic physics, reaction physics, reaction kinetics, geochronology, biomedicine, ion-molecule reactions, and determination of thermodynamic parameters ($\Delta G^{\circ}_{f}$, $K_a$, etc.). Mass spectrometry technology has thus begun to progress very rapidly as its uses have become more widely recognized. This has led to the development of entirely new instruments and applications.

Development trends have gone in the direction of increasingly complex mass analyzer designs requiring highly specialized components and tight manufacturing tolerances. Longer analysis times are often associated with this increased complexity. This, in turn, requires system designers to make significant design trade-offs between the accuracy of the mass measurements and the time required to obtain those measurements. However, such trade-offs have become increasingly intolerable in the competitive field of drug discovery and analysis. There, mass analyzers must be both highly accurate and provide for a high throughput of analytes.

Several mass analyzer embodiments based on ion separation in the presence of an electric field are illustrated in the figures of U.S. Pat. No. 5,726,448 to Smith et al, the structures of which are hereby incorporated by reference. FIGS. 3–5 of the '488 patent show a first embodiment of a mass analyzer having a mass filter chamber through which only ions of a selected range of mass-to-charge ratios are permitted to pass. In this embodiment, the mass filter chamber includes first and second electrode pairs that are connected to an RF signal source to generate an electric field therebetween. Each pair of electrodes is formed by an opposed pair of conductive plates. The planar faces of the first electrode pair face each other while the planar faces of the second electrode pair likewise face one another. However, the planar faces of the first electrode pair are disposed substantially perpendicular to the planar faces of the second electrode pair. Both the first and second electrode pairs are aligned along the same length of the chamber.

In a further embodiment, shown in FIG. 10 of the '488 patent, the second electrode pair is displaced from the first electrode pair along the length of the mass filter chamber. In all other respects, this embodiment is substantially similar to the one shown in FIGS. 3–5.

In each of the foregoing embodiments, the electric field generated at the second electrode pair is out of phase by $\pi/2$ from the electric field generated at the first electrode pair so that the ions are acted upon by at least two distinct, orthogonal electric fields. As predominantly noted in FIG. 3 of the '488 patent, the orthogonal electric fields are preferably sinusoidal in nature and combine to form a rotating electric field.

In operation, each ion enters the mass selection chamber at angles, $\theta$ and $\Phi$, with respect to a plane forming the inlet of the chamber. Whether or not the ion passes completely through the mass selection chamber depends on the mass-to-charge ratio of the ion as well as the frequency of the rotating electric field, the amplitude of the rotating electric field, the phase of the electric field at the time that the ion enters the chamber and the entry angles, $\theta$ and $\Phi$.

The present inventor has recognized that the existing mass analysis apparatus shown in the '448 patent may be improved in a variety of manners. For example, trade-offs must frequently be made between system throughput and mass resolution/sensitivity when employing existing mass analyzer constructions. Therefore, there is a need for mass analyzer constructions having increased throughput without corresponding sacrifices in manufacturing, mass resolution, and/or mass sensitivity goals. Further, the electrode configuration shown in the '488 patent generates less than optimal electric field shapes that are particularly undesirable when a device of that type is miniaturized.

SUMMARY OF THE INVENTION

An improved mass analyzer capable of parallel processing one or more analytes is set forth. The improved mass analyzer comprises a mass filter unit having a plurality of ion selection chambers disposed in parallel with one another. Each of the plurality of ion selection chambers respectively includes an ion inlet lying in an inlet plane and an ion outlet lying in an outlet plane. The mass analyzer further includes a plurality of electrodes disposed in the ion selection chambers and at least one RF signal generator connected to the plurality of electrodes to produce a rotating electric field in each ion selection chamber. A plurality of ion injectors are each coupled to inject an ion beam into the ion inlet of a respective ion selection chambers. The ions meeting predetermined mass-to-charge (m/Q) ratio requirements pass through the ion selection chambers to contact corresponding detection surfaces of an ion detector and/or ion detector array. The mass filter array may be constructed so that at least one pair of ion selection chambers share at least one common field generating electrode.

Further aspects of the present invention include an improved mass filter that can be used in the foregoing multi-processing configuration or in a single ion selection chamber device. The mass filter comprises at least a first pair of opposed electrodes as well as a second pair of opposed electrodes. Each electrode of the first pair includes a concave electrode surface. The concave electrode surfaces of the opposed electrodes are disposed to face one another. Likewise, the electrodes of the second pair of opposed electrodes have concave electrode surfaces that face one another. The concave electrode surfaces of the second pair opposed electrodes are angularly displaced with respect to the concave electrode surfaces of the first pair of opposed electrodes. At least one RF signal generator is connected to the electrodes of the first and second electrode pairs to generate a rotating electric field between the concave electrode surfaces.

DESCRIPTION OF THE DRAWINGS

FIGS. 6A and 6B illustrate the electric field lines and corresponding ion trajectory, respectively, in an ion selection chamber having parallel plate electrodes.

FIGS. 7A and 7B illustrate the electric field lines and corresponding ion trajectory, respectively, in an ion selection chamber having non-planar electric field generating electrodes.

DESCRIPTION OF A PREFERRED EMBODIMENT OF THE INVENTION

Figure 1:
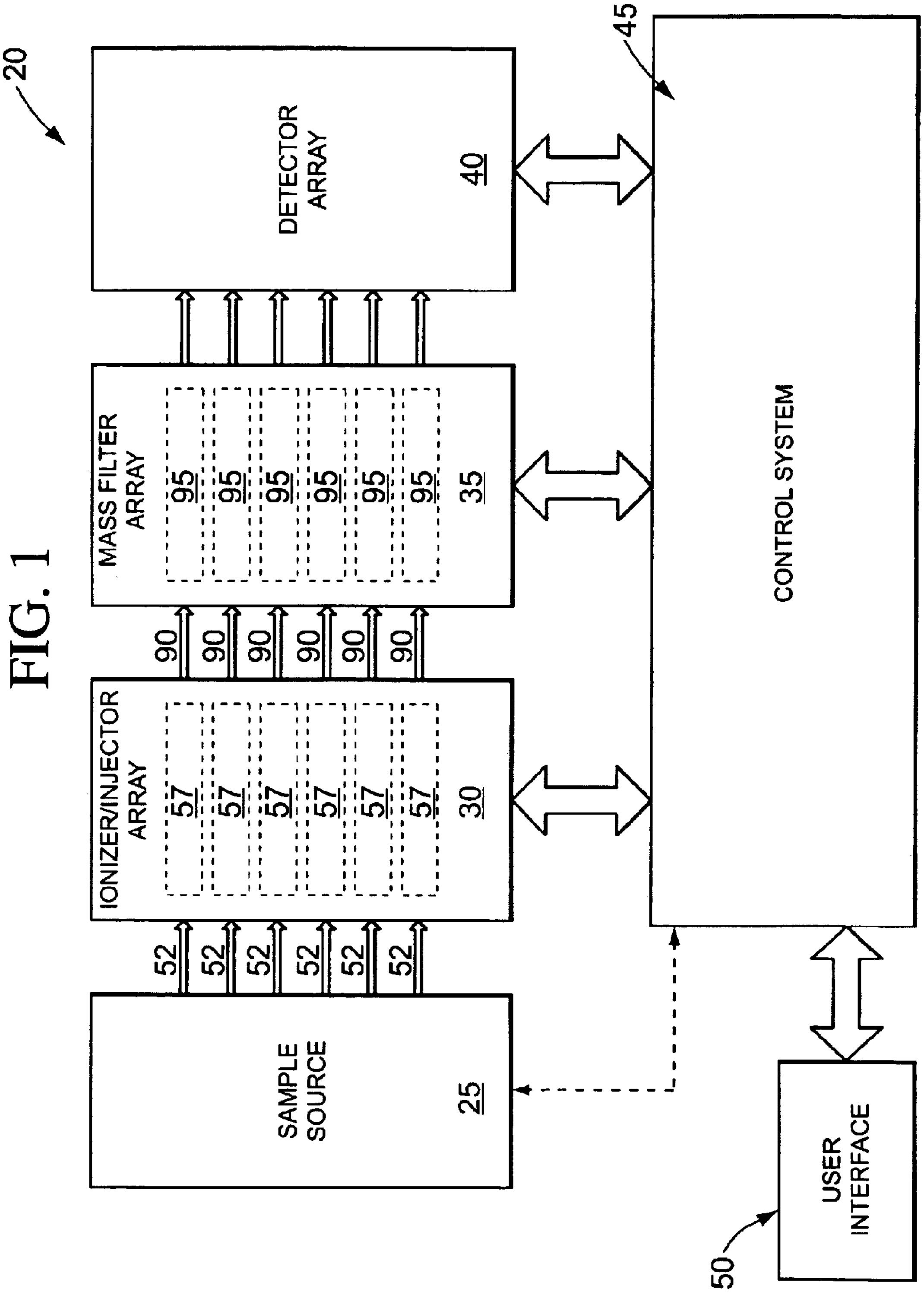
FIG. 1 is a schematic block diagram of one embodiment of a mass analysis system constructed in accordance with the teachings of the present invention.

The basic components of a mass analyzer constructed in accordance with one embodiment of the invention are shown in FIG. 1 in block diagram form. As illustrated, the analyzer 20 includes a sample source unit 25, an ionizer/ion injector array 30, a mass filter array 35, and an ion detector array 40. The components of the mass analyzer 20 may be automated by one or more programmable control systems 45. For example, control system 45 may be used to execute one or more of the following automation tasks:

a) control of the ionization and ion injection parameters of one or more of the components of the ionizer/ion injector array 30 (i.e., ion beam focusing, ion beam entrance angle into individual chambers of the mass filter array 35, ion injection timing, ionization energy, ion exit velocity, etc.);

b) control of the electric field parameters within individual ion selection chambers of the mass filter array 35 to select only ions of a desired m/Q range for detection;

c) control of the position of the ion detection portions of the ion detector array 40 with respect to the ion outlets of the individual ion selection chambers of the mass filter array 35 to facilitate detection of ions exiting the chambers at a predetermined exit angles, $\theta_e$ and $\Phi_e$, to the general exclusion of ions having other exit angles;

d) analysis of the data received from the mass analyzer 20 for presentation to a user or for subsequent data processing.

The parameters used to execute one or more of the foregoing automation tasks may be entered into the control system 45 by a human operator through, for example, user interface 50. Additionally, user interface 50 may be used to display information to the human operator for system monitoring purposes or the like. As such, user interface 50 may include a keyboard, display, switches, lamps, touch display, or any combination of these items.

With reference to FIG. 1, the material that is to be analyzed is provided to analyzer 20 through the sample source unit 25. Sample source unit 25 may include a single sample outlet or multiple sample outlets 52 (multiple outlets are shown in the illustrated embodiment). Further, the sample source unit 25 can be configured to provide a single material type at all of the sample outlets 52, different material types at the different sample outlets 52 or a combination of the foregoing in which a first group of sample outlets are configured to provide a first sample material while a second group of sample outlets are configured to provide a second sample material.

The sample material at each of the sample outlets 52 is provided to the input of a respective ionizer/ion injector 57 of the ionizer/ion injector array 30. Sample source unit 25 can introduce the sample material (which includes the analyte) at the sample outlets 52 in several ways, the most common being with a direct insertion probe, or by infusion through a capillary column. The individual ionizers/injectors 57 of the ionizer/ion injector array 30 may therefore be adapted to interface directly with whatever form the sample takes at the respective output 52. For example, the individual ionizers/injectors 57 can be adapted to interface directly with the output of gas chromatography equipment, liquid chromatography equipment, and/or capillary electrophoresis equipment. It will be recognized that any treatment of a sample material prior to the point at which sample source unit 25 provides it to the respective ionizer/ion injector 57 of array 30 is dependent on the particular analysis requirements.

The ionizer/ion injector array 30 may include a single inlet for receiving a single sample type from the sample source unit 25 or, as shown in the illustrated embodiment, multiple inlets respectively associated with each of the sample outlets 52. Upon receiving the samples from outlets 52, the ionizer/ion injectors 57 operate to ionize the molecules of the analyte included in the received samples and direct the ionized analyte molecules as a plurality of focused beams into respective ion selection chambers 95 of the mass filter array 35.

The ionization and injection can be accomplished using any of a number of techniques. For example, one method that allows for the ionization and transfer of the sample material from a condensed phase to the gas phase is known as Matrix-Assisted Laser Desorption/Ionization (MALDI). Another technique is known as Fast Atom/Ion Bombardment (FAB), which uses a high-energy beam of Xe atoms, $Cs^+$ions, or massive glycerol-$NH_4$ clusters to sputter the sample and matrix received from the sample source unit 25. The matrix is typically a non-volatile solvent in which the sample is dissolved. Although the ionization and ion injection processes of the illustrated embodiment are shown to occur in a single unit, it will be recognized that these processes can be executed in two or more separate units.

Figure 2:
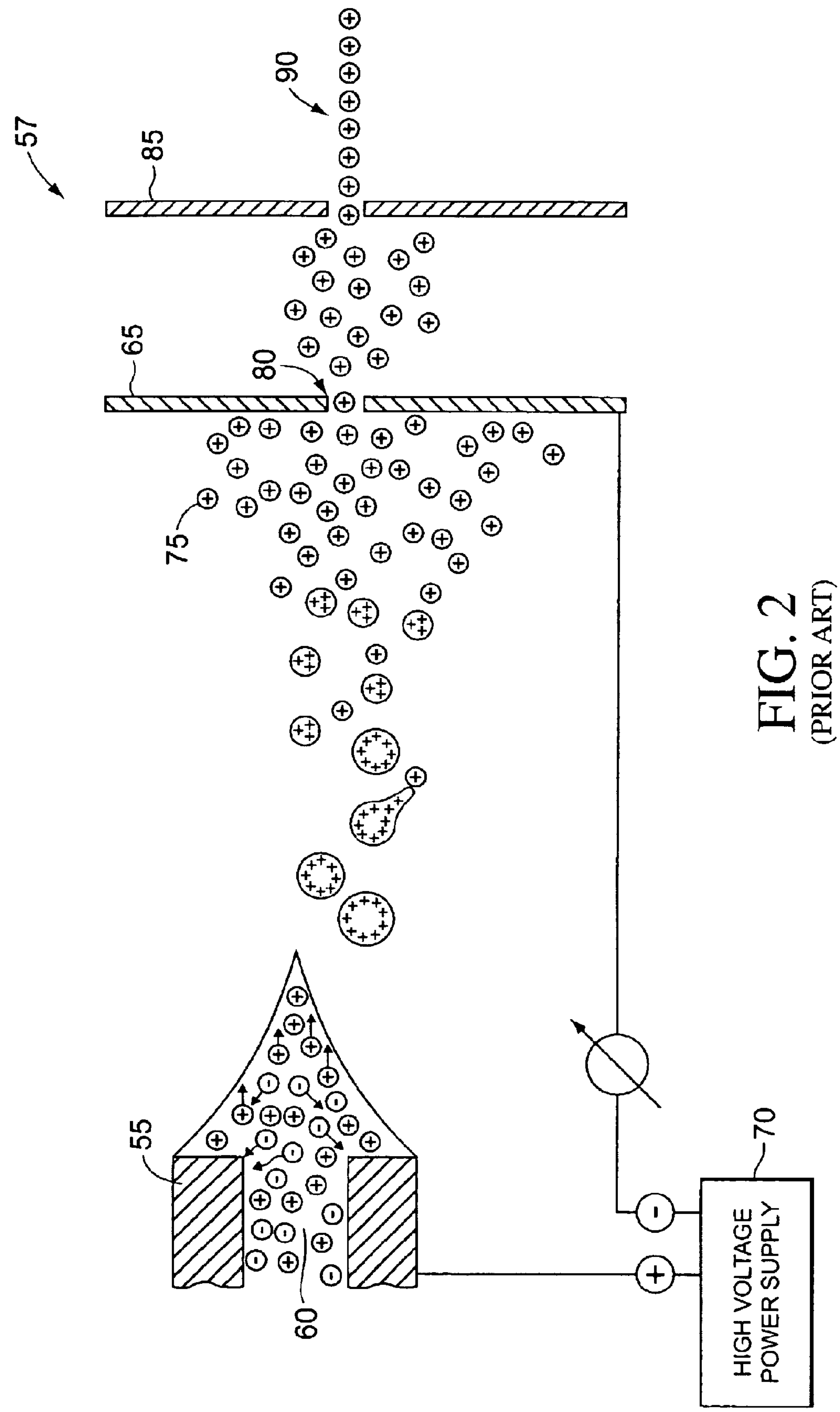
FIG. 2 (PRIOR ART)
FIG. 2 is an illustration of one embodiment of an electrospray ionizer suitable for use in the mass analysis system shown in FIG. 1.

A still further technique that may be implemented by the ionizer/ion injector array 30 to introduce the analyte into the mass filter array 35 is electrospray ionization. One embodiment of a basic electrospray ionizer/ion injector unit 57 is shown in FIG. 2. As illustrated, the ionizer/ion injector unit 57 is comprised of a capillary tube having an electrically conductive capillary tip 55 through which a sample liquid 60 is provided for ionization and injection into the respective ion selection chamber 95 of the mass filter array 35. The sample liquid 60 typically comprises a solvent containing an amount of the sample analyte. A counter-electrode 65 is disposed opposite the capillary tip 55 and an electric field is set-up between them by a power supply 70.

In operation, the electrically conductive capillary tip 55 oxidizes the solvent and sample analyte resulting in a meniscus of liquid that is pulled toward the counter-electrode 65. Small droplets of the liquid emerge from the tip of the meniscus and travel toward the counter-electrode 65. As the droplets make their way to the counter-electrode 65 under the influence of the electric field, the solvent tends to evaporate thereby leaving only charged gaseous ions 75 comprised of ionized analyte behind. A number of these charged gaseous ions 75 are accelerated through an orifice 80 in the counter-electrode 65 where a focusing lens 85 aligns them into a narrow ion beam 90. The narrow ion beam 90 is provided to the inlet of the respective ion selection chamber 95 of mass filter array 35 for separation of the ions based on their mass to charge values, m/Q.

Mass filter unit 35 operates as an ion filter based on the principles that govern the motion of charged particles in an electric field. The charged particles in the present case are ionized molecules with one or more net charges that are received from the ionizer/ion injectors 57. The ion charges may be positive or negative. Ions entering the device are filtered according to their m/Q values. An ion of a particular m/Q will be detectable when the appropriate adjustable instrument parameters are set to allow passage of the ion through the respective ion selection chamber 95 for impact with one or more ion detection portions of the ion detector array 40.

Figure 3A:
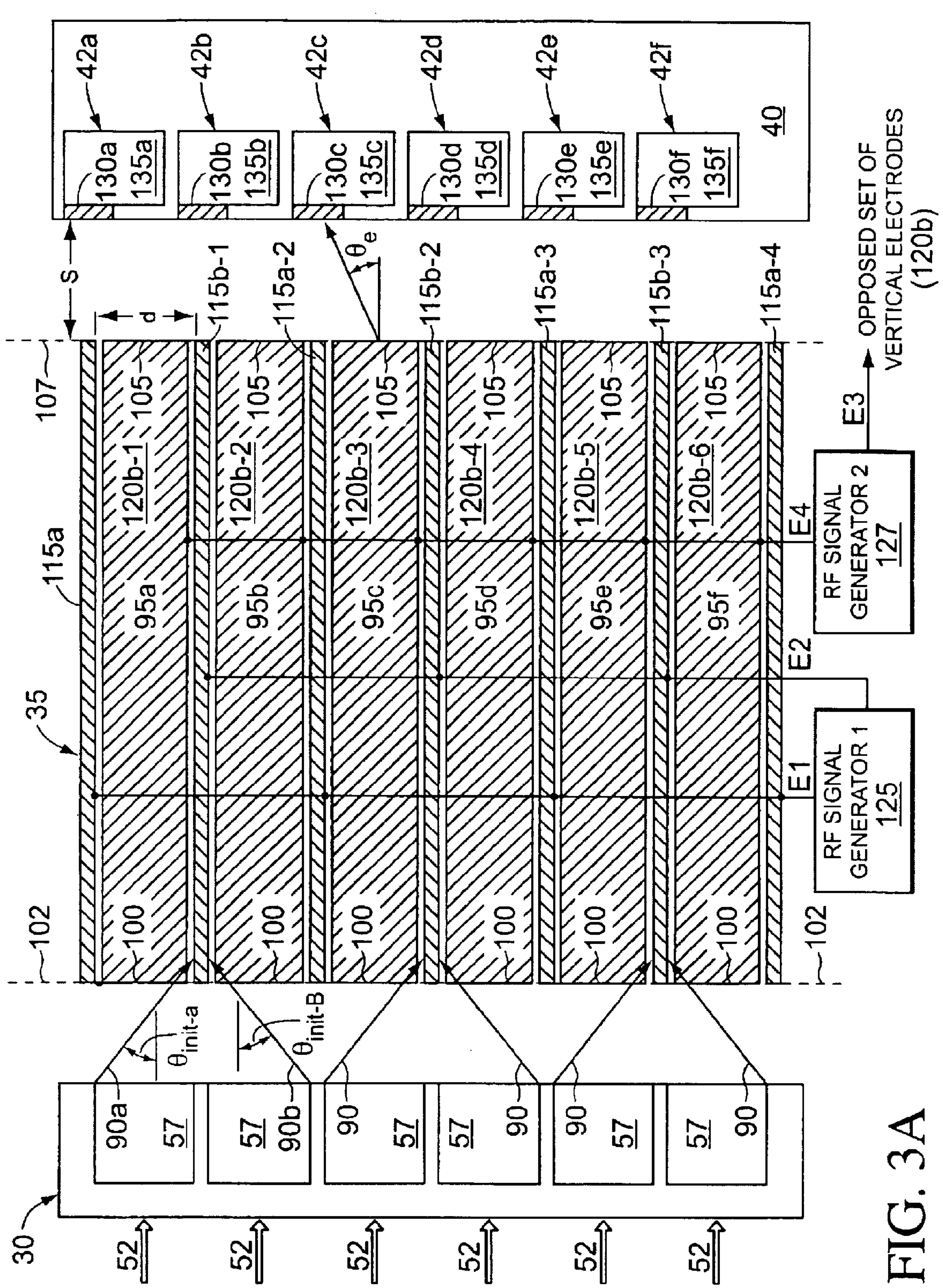
FIG. 3A is a side plan view of selected portions of one embodiment of the mass analyzer of FIG. 1.
Figure 3B:
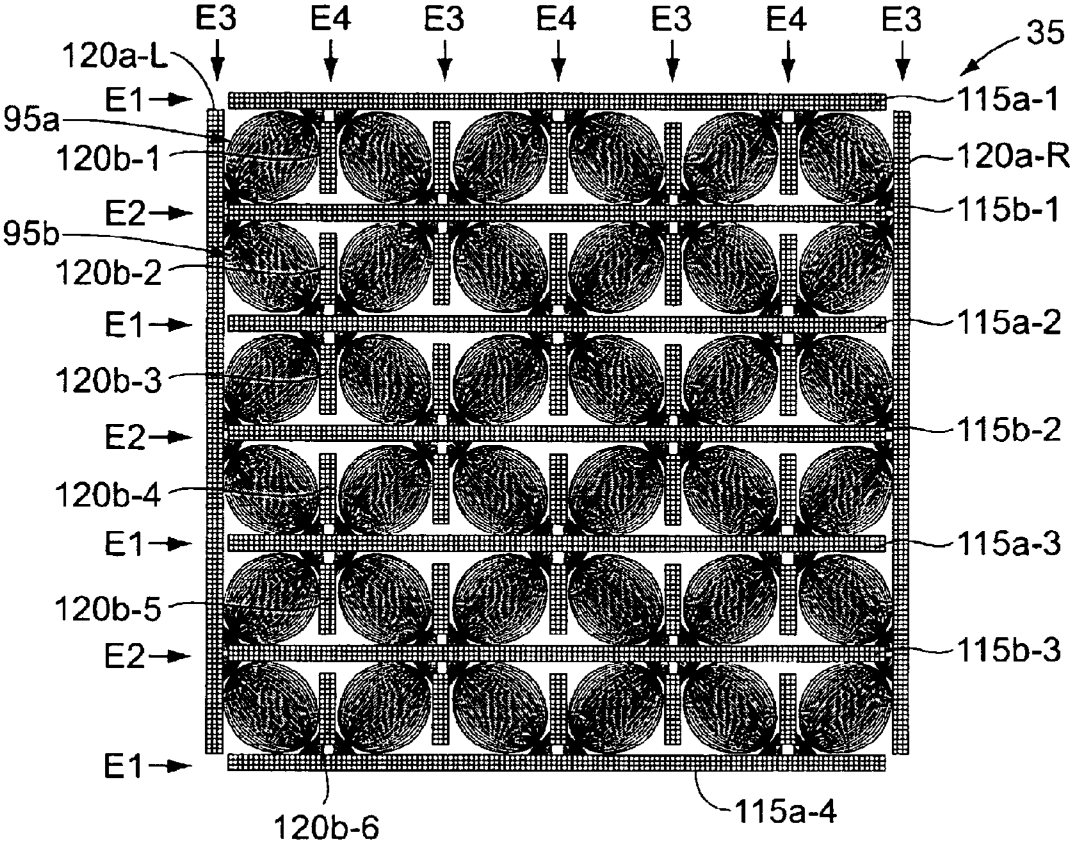
FIG. 3B is an end view of the array of ion selection chambers shown in FIG. 3A illustrating the electric fields that may be generated within each of the chambers.
Figure 3C:
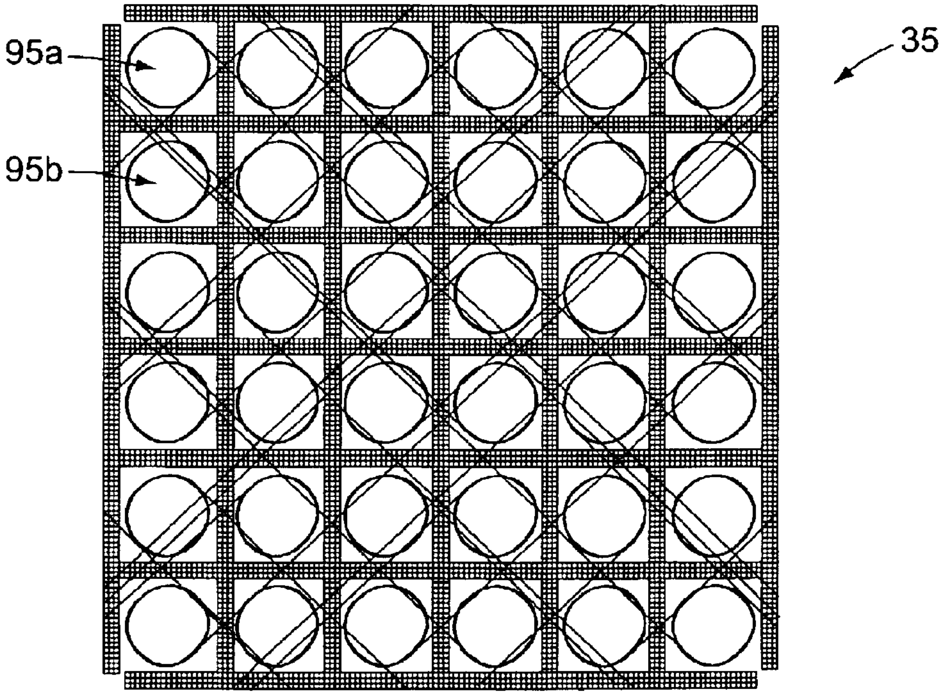
FIG. 3C is an end in view of the array of ion selection chambers shown in FIG. 3B illustrating the ion trajectories generated by the electric fields within each of the chambers.

A mass filter array 35 constructed in accordance with one aspect of the present invention is shown in FIGS. 3A–3C. The mass filter unit 35 includes a plurality of ion selection chambers, shown generally at 95, that are arranged in a 6×6 matrix array. It will be recognized, in view of the teachings herein, that the ion selection chambers 95 may be alternatively arranged in a single vertical or horizontal array or in the form of a matrix having a different number of columns and rows.

Each of the ion selection chambers includes an ion inlet 100 lying in a first plane 102 and an ion outlet 105 lying in a second plane 107. The ion inlets 100 of the illustrated embodiment all lie generally in the same plane 102 while the ion outlets 105 all lie generally in the same plane 105. However, in some circumstances, it may be desirable to construct the mass filter array 35 so that it employs a plurality of ion selection chambers having different lengths, in which case two or more of the ion inlets 100 and/or ion outlets 105 of different ion selection chambers will not be coplanar.

In the illustrated embodiment, two opposed pairs of conductive parallel plate electrodes 115*a*, 115*b* and 120*a*, 120*b* are employed in each ion selection chamber 95. The conductive planar surface of each electrode 115*a* and 115*b* of the first pair of opposed electrodes are disposed to face one another within the respective chamber 95. Similarly, the conductive planar surface of each electrode 120*a* and 120*b* of the second pair of opposed electrodes are disposed to face one another within the respective chamber 95. The conductive planar surfaces of the first pair of opposed electrodes 115*a* and 115*b* of a given ion selection chamber are spaced from one another by a distance d, for example, along a given axis. Likewise, the conductive planar surfaces of the second pair of opposed electrodes 120*a* and 120*b* of the ion selection chamber are preferably spaced from one another by the same distance d (although other separation distances may be used dependent on the specific design criterion). Although the magnitude of distance d may vary between different ion selection chambers 95, it is often preferable to keep this distance constant from chamber-to-chamber.

One manner in which the construction of mass filter array 35 can be optimized is through the sharing of electrodes by adjacent ion selection chambers 95. To this end, ion selection chamber 95*a* generates its electric field using upper electrode 115*a*-1, lower electrode 115*b*-1, left electrode 120*a*-L and right electrode 120*b*-1. In turn, ion selection chamber 95*b* generates its electric field using electrode 115*b*-l as its upper electrode, 115*a*-2 as its lower electrode, left electrode 120*a* and right electrode 120*b*-2. Ion selection chambers 95*a* and 95*b* therefore share at least electrodes 115*b*-1 and 120*a*-L resulting in a mass filter construction in which the number of electrodes required for electric field generation is reduced. Notably, left electrode 120*a*-L serves as the left electrode for all of the left-most ion selection chambers, top electrode 115*a*-1 is shared by all of the ion selection chambers along the top of the matrix, right electrode 120*a*-R is common to all of the right-most ion selection chambers, and bottom electrode 115*a*-4 is shared by all of the ion selection chambers along the bottom of the matrix. Additionally, each pair of opposed electrodes 115*a* and 115*b* are shared in common with all of the ion selection chambers of a given horizontal row and, as shown in the illustrated embodiment, selected electrodes of such pairs may be shared by ion selection chambers that are vertically adjacent one another. Alternatively, or in addition to the foregoing configuration, the individual electrodes 120*a* and 120*b* of the second electrode pair can be configured so that they are shared between vertically adjacent ion selection chambers and/or horizontally adjacent ion selection chambers. A substantial number of alternative shared electrode constructions can be realized based on the teachings set forth herein.

With reference to FIGS. 3A and 3B, the electrodes of each pair of opposed electrodes of the mass filter array 35 are connected to opposite poles of a respective power source, such as RF signal generators 125 and 127. RF signal generators 125 and 127 provide time-dependent voltages E1, E2, E3, E4 to create a rotating electric field in the open region between the electrodes of each ion selection chamber 95. When adjacent ion selection chambers are configured to share at least one electrode in the manner shown in FIG. 3A, then the first pole of the RF signal generator 125 is connected to electrode 115*a* of the first pair of opposed electrodes used in each ion selection chamber to provide voltage E1. The second pole of generator 125 is connected to electrode 115*b* of the first opposed electrode pairs to provide voltage E2. Similarly, the first pole of the RF signal generator 127 is connected to each electrode 120*a* of the second pair of opposed electrodes used in each ion selection chamber to provide voltage E3. The second pole of generator 127 is connected to each electrode 120*b* of the second pair of opposed electrodes to provide voltage E4. Consequently, adjacent ion selection chambers, such as chambers 95*a* and 95*b*, have electric fields of substantially the same magnitude that are approximately 180° out of phase with one another. This is illustrated by the electric field lines shown in each of the ion selection chambers of FIG. 3B, which gives rise to the ion trajectory cross-section shown in FIG. 3C.

Figure 4:
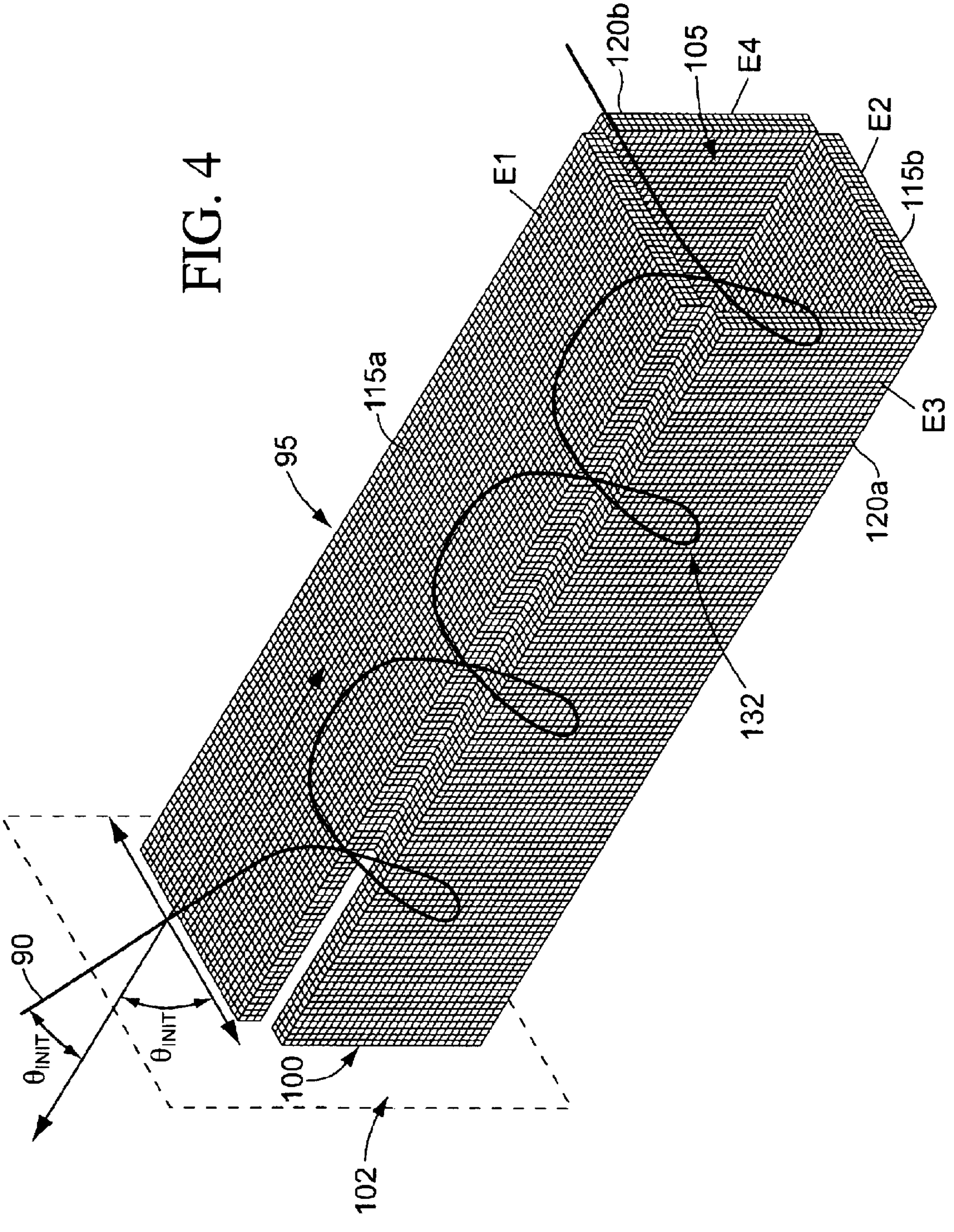
FIG. 4 is a perspective view of a single ion selection chamber that may be used in the array of FIG. 3B.

A single ion selection chamber 95 of the ion selection array 35 is illustrated in FIG. 4. As depicted in this figure, the respective ionizer/ion 57 may provide its ion beam 90 at predetermined entry angles, $\theta_{init}$, $\Phi_{init}$ with respect to the plane 102 of the ion inlets 100. In such instances, each ion beam 90 is directed into the respective chamber and is subject to a rotating electric field that is generated between the electrodes of the chamber. The rotating electric field imparts three-dimensional motion forces on the ions as they proceed through the ion selection chamber 95. Whether a given ion ultimately passes to the outlet 105 depends on, among other things, the m/Q value of the ion. If the m/Q of the ion either exceeds or is below a predetermined value (set by the parameters used for the ion selection chamber 95), then the ion will strike one of the electrodes of the chamber 95 before it can reach the outlet 105. If the m/Q of the ion falls within a selected range, it will proceed along a generally helical trajectory, similar to the one shown at 132 of FIG. 4, and ultimately exit from the chamber at outlet 105. An end view of the 6×6 matrix selection array 35 that illustrates the cross-section of this projected trajectory through each of the individual ion selection chambers is provided in FIG. 3C.

Figure 5:
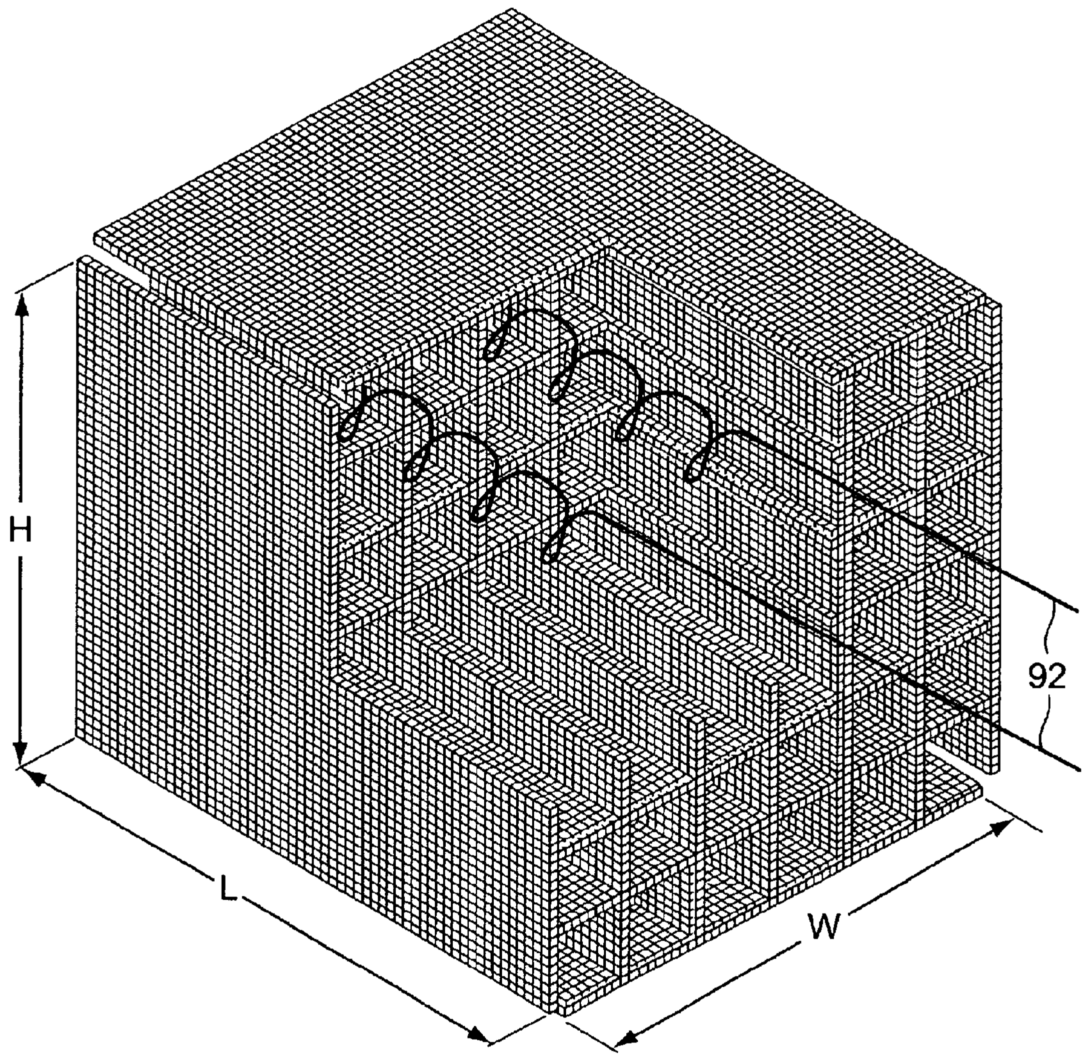
FIG. 5 is a perspective cut-away view of the array shown in FIGS. 3A through 3C.

FIG. 5 is a perspective view of a partial cutaway of the embodiment of the 6×6 matrix selection array 35. Although the dimensions of the overall matrix are dependent on the design specifications, exemplary values include H=14 mm, L=20 mm and W=14 mm. Exemplary trajectory paths for ions in non-adjacent mass selection chambers are also shown at 92.

With reference again to FIG. 4, substantial values for entrance angles $\theta_{init}$, $\Phi_{init}$ are preferred to smaller angle values to thereby optimize the m/Q resolution of the overall mass analyzer 20. For example, entrance angle values of at least 40° and, more preferably, values of at least 60° may be used for either or both of $\theta_{init}$, $\Phi_{init}$.

As generally shown in connection with FIG. 3A, the entrance angles of the ion beams associated with adjacent ion selection chambers that share at least one electrode may have the same magnitude (i.e., a value of at least 60°) but have opposite signs. For example, the entrance angle, $\theta_{init\text{-}a}$, of the ion beam 90*a* associated with ion selection chamber 95*a* may be 65° while the entrance angle, $\theta_{init\text{-}b}$, of the ion beam 90*b* associated with ion selection chamber 95*b* may be −65°. If desired, the ion beams associated with adjacent (as well as non-adjacent) ion selection chambers may have different entrance angles to accommodate various analysis situations.

FIG. 3A also illustrates another separately unique aspect of the overall analyzer 20. More particularly, this embodiment includes a unique relationship between individual ion detectors 42 of the ion detector array 40 and the outlets 105 of the ion selection chambers 95. More particularly, each ion detector 42 is respectively associated with at least one of the ion selection chambers. Each ion detector 42 comprises an ion detection surface 130 that is arranged to principally detect ions that exit substantially at predetermined exit angle(s), $\theta_e$ and/or $\Phi_e$,(only $\theta_e$ being illustrated in FIG. 3A) with respect to the plane of outlet 105 of the respective ion selection chamber and to the general exclusion of ions leaving the respective chamber at other exit angles. To this end, the ion detection surface 130 preferably has a surface area that is smaller than the area of the opening of the outlet 105 of the respective ion selection chamber. Further, the ion detection surface 130 may be displaced and/or spaced a distance, S, from the respective ion outlet 105 in along the main axis of the respective chamber 95. Larger values for the distance, S, are preferable since such larger values provide greater m/Q resolution than do smaller values. However, the maximum value for the distance, S, will depend on the overall size constraints placed on the analyzer 20 in specific design situations.

Although the position of a given ion detection surface 130 may be fixed with respect to the corresponding ion outlet 105, the illustrated embodiment allows the position of one or more of the ion detection surfaces 130 to be varied. To this end, each ion detector 42 includes one or more automated actuators 135 that are connected to the ion detection surface 130 to move the ion detection surface 130 along one or more axes. This allows fine tuning of the ion detection sensitivity and m/Q resolution of the analyzer 20. Further, individual adjustments to the positions of the individual ion detection surfaces 130 allows the analyzer 20 to implement a wide range of analysis processes having different testing criterion. As noted above, the actuator(s) 135 may be driven to place the respective ion detection surface 135 at the desired position by control system 45. The specific position parameters used by the control system 45 may be input as express position coordinate values through the user interface 50 or, alternatively, may be derived indirectly from other analysis parameters through system programming.

The proper position of a given ion detection surface 130 under a known set of test requirements may be derived through empirical data or through direct calculation of the exit angles, $\theta_e$ and $\Phi_e$. The exit angles, $\theta_e$ and $\Phi_e$, may be found by knowing the initial velocity of the ion as it enters the respective ion selection chamber, $V_0$, the time that the ion passes through outlet plane 107 to exit the respective ion outlet 105, and the z and y components ($V_z$ and $V_y$) of the velocity of the ion at the time of exit.

As is clear from the foregoing description, the mass analyzer 20 has the capability of processing one or more analytes in a parallel manner. For example, the mass analyzer 20 may concurrently process a plurality of samples that pass through the analyzer at substantially the same time. Alternatively, parallel processing may proceed with a plurality of samples passing through the analyzer at substantially different times. In each instance, the mass analyzer directs at least two samples (of the same or different substance) through separate ion selection chambers of the mass filter array.

In practice, the maximum magnitude of the RF voltages, E1 through E4, for a given ion selection chamber are held constant and the mass spectrum for a sample is obtained by scanning through a set of predetermined frequencies, ω, with the RF signal generators 125 and 127. Exemplary ranges include frequencies in the several hundreds of kilohertz range with voltages in the several hundreds of volts range. Frequency scanning, for example, may be placed under the control of control system 45. At each frequency, ω, only ions within a selected m/Q range will follow the stable trajectory through the chamber. The parameters of analyzer 20 should be adjusted so those ions with stable trajectories approach the electrodes 115*a*, 115*b*, 120*a* and 120*b* as closely as possible as they travel to the respective ion detectors 42. Ions with m/Q values that are not selected at the prescribed frequency will then either crash into one of the electrodes before completing their journey through the respective ion selection chamber 95 or, alternatively, they will miss the respective ion detection surface 130. One set of parameters that may be adjusted in this regard are the entrance angles, $\theta_{init}$ and $\Phi_{init}$. As noted above, larger entrance angles are preferable-to smaller entrance angles, with angles of at least 40° being desirable and angles of at least 60° or more providing even higher m/Q selectivity and resolution. Increasing the aspect ratio of the device (i.e., increasing the length of the chamber versus the parallel spacing between each electrode pair 115*a*, 115*b* and 120*a*, 120*b*) will also result in higher resolution.

The homogeneity of the electric field in a given ion selection chamber is also a factor in determining the ability of that ion selection chamber to pass only ions within a narrow m/Q range. FIG. 6A is an end view of a single ion selection chamber 95 constructed with parallel plate electrodes 115*a*, 115*b*, 120*a* and 120*b*, such as those used in the foregoing embodiments. FIG. 6*a* also illustrates the corresponding electric field line distribution within the chamber. As shown, the electric field lines, depicted at 220, tend to be very distorted in the gaps 225, 230, 235 and 240 between the electrodes at the corners of the chamber 95. Such distortions in the electric field lines give rise to corresponding distortions in the path traveled by the ions through the chamber 95. FIG. 6B illustrates just such a distorted ion trajectory 245 that corresponds to an ion passing through a chamber 95 having the electric field pattern shown in FIG. 6A. As shown, the ion trajectory 245 does not have a circular cross-section and, therefore, the ion path through the chamber 95 substantially deviates from the desired helical travel path. Rather than having a circular cross-section, the cross-section of the trajectory 245 is elongated between electrode plates 115*a* and 115*b* as well as between electrode plates 120*a* and 120*b*. This distortion in the direction of the electrode plates decreases the overall resolution of the mass filter chamber 95.

An alternative embodiment of an ion selection chamber 95 is illustrated in FIGS. 7A and 7B. Generally stated, the conductive portions of the electrodes that provide the electric field within this alternative chamber design are specifically formed to generate a more homogenous electric field, shown by field lines 220, for ion selection. In the illustrated embodiment, a more homogenous electric field is obtained by constructing the electrodes 115*a*, 115*b*, 120*a* and 120*b* so that the field generating portions that face the interior of chamber 95 are non-planar. In this example, the conductive surfaces of electrodes 115*a*, 115*b*, 120*a* and 120*b* are concave-shaped. Comparing FIG. 6A with FIG. 7A, it can be seen that the use of concave-shaped electrodes significantly reduces the distortions that otherwise occur in the gaps 225, 230, 235 and 240 between the electrodes 115*a*, 115*b*, 120*a* and 120*b*.

FIG. 7B illustrates the ion trajectory 245 that corresponds to an ion passing through a chamber 95 having the substantially homogenous electric field shown in FIG. 7A. As illustrated, ion trajectory 245 has a cross-section that is substantially more circular than the ion trajectory shown in FIG. 6B thereby giving rise to an overall ion trajectory that is substantially closer to the desired helical path through chamber 95. The trajectory 245 of this embodiment is no longer substantially elongated between electrode plates 115*a* and 115*b* nor between electrode plates 120*a* and 120*b*. Rather, the distortions in the direction of the electrode plates are reduced to an insignificant level thereby increasing the overall resolution of the mass filter chamber 95. This reduction in the electric field distortions becomes increasingly important as attempts are made to miniaturize mass analyzers.

Figure 8:
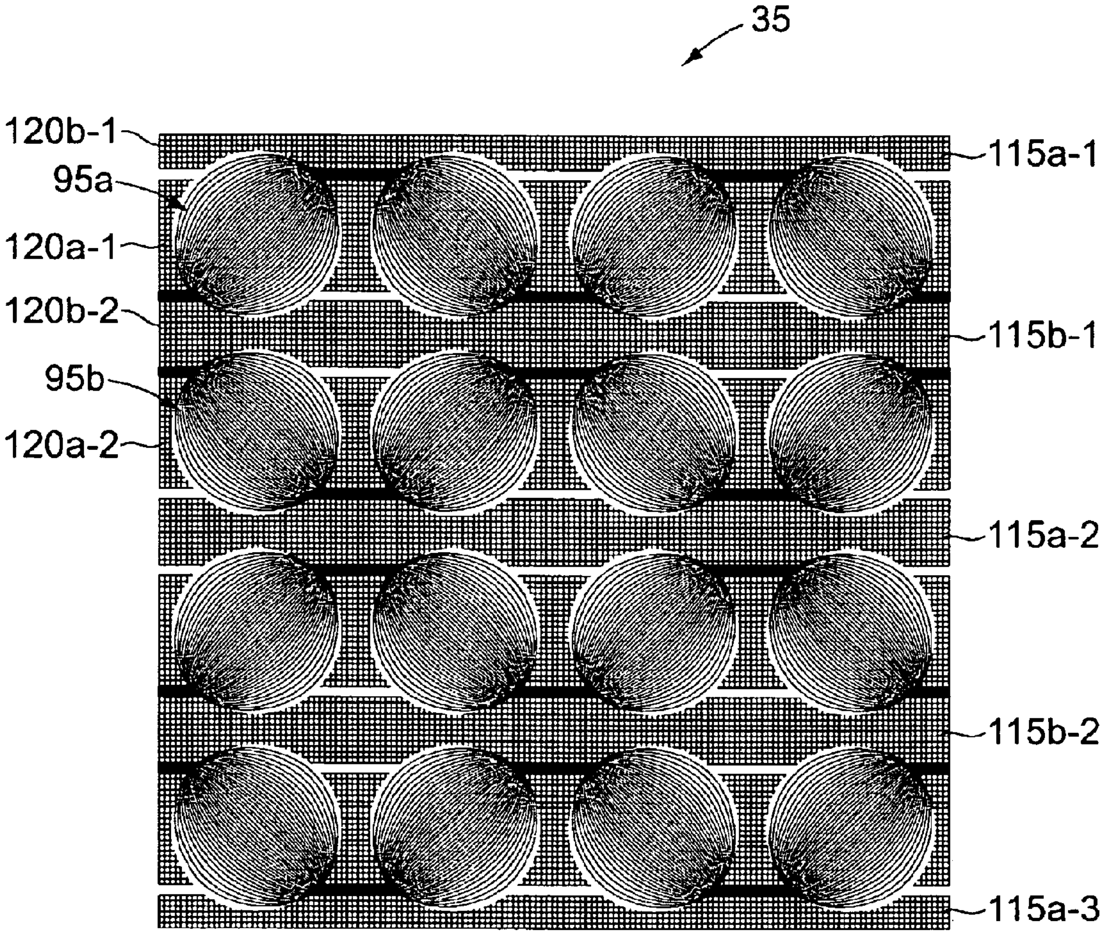
FIG. 8 is an end view of a mass filter in which the ion selection chambers are arranged in a 4×4 array and have non-planar electric field generating electrodes.

FIG. 8 illustrates an embodiment of the mass filter array 35 in which the individual ion selection chambers 95 employ non-planar electrodes, such as the ones set forth in FIGS. 7A and 7B. The particular mass filter array 35 shown here is in the form of a 4×4 matrix.

In the embodiment of FIG. 8, the electrodes of the ion selection chambers 95 may be connected to one or more RF signal generators as described with respect to the embodiment of FIG. 3A to thereby generate the electric field lines shown in FIG. 8. Additionally, the electrodes of the mass filter array 35 can be shared between adjacent and/or non-adjacent ion selection chambers 95 in the manner described in connection with FIG. 3A to meet, for example, design, manufacturing and/or cost goals. In the illustrated embodiment, for example, electrodes 115*a*-1 and 115*b*-1 are shared by all of the ion selection chambers of the uppermost row of the array 35. Further, ion selection chambers 95*a* and 95*b* share electrode 115*b*-1. This sharing arrangement is exemplary in nature and it will be readily recognized, in view of the teachings herein, that other electrode sharing arrangements may be constructed.

Numerous modifications may be made to the foregoing system without departing from the basic teachings thereof. Although the present invention has been described in substantial detail with reference to one or more specific embodiments, those of skill in the art will recognize that changes may be made thereto without departing from the scope and spirit of the invention as set forth in the appended claims.

What is claimed is:

1. A mass filter array comprising:

a first ion selection chamber having an ion inlet lying in an inlet plane and an ion outlet lying in an outlet plane, the first ion selection chamber further having a first plurality of electrodes disposed between said ion inlet and said ion outlet;

a second ion selection chamber having an ion inlet lying in an inlet plane and an ion outlet lying in an outlet plane, the second ion selection chamber further having a second plurality of electrodes disposed between said ion inlet and said ion outlet, the first and second plurality of electrodes including at least one common electrode shared by both the first and second ion selection chambers;

an RF signal generator connected to said first and second plurality of electrodes to produce a rotating electric field respectively in each of said first and second ion selection chambers.

2. A mass analyzer as claimed in claim 1 wherein either or both of said plurality of electrodes comprise at least one electrode having at least two conductive exterior surfaces separated by a dielectric core.

3. A mass filter array as claimed in claim 1 wherein said first plurality of electrodes and said second plurality of electrodes share at least one common electrode to produce the rotating electric fields.

4. A mass filter array as claimed in claim 1 wherein said rotating electric field in said first ion selection chamber is substantially equal in magnitude to said rotating electric field in said second ion selection chamber.

5. A mass filter array as claimed in claim 4 wherein said rotating electric field in said first ion selection chamber is out of phase from said rotating electric field in said second ion selection chamber.

6. A mass filter array as claimed in claim 5 wherein said first and second pair of opposed electrodes are formed as conductive plates.

7. A mass filter array as claimed in claim 1 wherein said first plurality of electrodes comprises:

a first pair of opposed electrodes each electrode having a planar surface;

a second pair of opposed electrodes each having a planar surface, the planar surfaces of said second pair of opposed electrodes being oriented generally perpendicular to the planar surfaces of said first pair of opposed electrodes;

said RF signal generator being connected to the first and second pair of opposed electrodes to generate a first rotating electric field therebetween.

8. A mass filter array as claimed in claim 7 wherein said second plurality of electrodes comprises:

a third pair of opposed electrodes each having a planar surface;

a fourth pair of opposed electrodes each having a planar surface, the planar surfaces of said fourth pair of opposed electrodes being oriented generally perpendicular to the planar surfaces of said third pair of opposed electrodes;

said RF signal generator being connected to said third and fourth pair of opposed electrodes to generate a second rotating electric field therebetween that is out of phase with the first rotating electric field.

9. A mass filter array as claimed in claim 8 wherein at least one electrode of either said first or second pair of opposed electrodes is shared with either said third or fourth pair of opposed electrodes.

10. A mass filter array as claimed in claim 8 wherein said RF signal generator includes first and second terminals of opposite polarity, said first and third pair of opposed electrodes being connected to said first terminal and said second and fourth pair of opposed electrodes being connected to said second terminal.

11. A mass filter array as claimed in claim 7 wherein said third and fourth pair of opposed electrodes are in the form of conductive plates.

12. A mass filter array as claimed in claim 1 wherein said first plurality of electrodes comprises:

a first pair of opposed electrodes each electrode having a concave electrode surface;

a second pair of opposed electrodes each having a concave electrode surface, the concave electrode surfaces of said second pair of opposed electrodes being angularly displaced with respect to the concave electrode surfaces of said first pair of opposed electrodes by about 90 degrees;

said RF signal generator being connected to the first and second pair of opposed electrodes to generate a first rotating electric field therebetween.

13. A mass filter array as claimed in claim 12 wherein said second plurality of electrodes comprises:

a third pair of opposed electrodes each having a concave electrode surface;

a fourth pair of opposed electrodes each having a concave electrode surface, the concave electrode surfaces of said fourth pair of opposed electrodes being angularly displaced with respect to the concave electrode surfaces of said third pair of opposed electrodes by about 90 degrees;

said RF signal generator being connected to said third and fourth pair of opposed electrodes to generate a second rotating electric field therebetween that is out of phase with said first rotating electric field.

14. A mass filter array as claimed in claim 13 wherein said RF signal generator includes first and second terminals of opposite polarity, said first and third pair of opposed electrodes being connected to said first terminal and said second and fourth pair of opposed electrodes being connected to said second terminal.

15. A mass filter array as claimed in claim 12 wherein at least one electrode of either said first or second pair of opposed electrodes is shared with either said third or fourth pair of opposed electrodes.

16. A mass analyzer comprising:

a mass filter unit having a plurality of ion selection chambers disposed in parallel with one another, each of the plurality of ion selection chambers respectively having an ion inlet lying in an inlet plane and an ion outlet lying in an outlet plane;

a plurality of electrodes disposed in said plurality of ion selection chambers;

at least one RF signal generator connected to said plurality of electrodes to produce a rotating electric field in each of said plurality of ion selection chambers;

a plurality of ion injectors respectively coupled to each of said ion inlets of said plurality of ion selection chambers to inject ions into each of said plurality of ion selection chambers.

17. A mass analyzer as claimed in claim 16 wherein said plurality of electrodes comprise at least one electrode having at least two conductive exterior surfaces separated by a dielectric core.

18. A mass analyzer as claimed in claim 16 wherein the inlets of said plurality of ion selection chambers lie substantially in a single inlet plane.

19. A mass analyzer as claimed in claim 18 wherein the outlets of said plurality of ion selection chambers lie substantially in a single outlet plane.

20. A mass analyzer as claimed in claim 16 wherein the outlets of said plurality of ion selection chambers lie substantially in a single outlet plane.

21. A mass analyzer as claimed in claim 16 wherein adjacent ones of said plurality of ion selection chambers share at least one of said plurality of electrodes for generating the rotating electric field in the respective ion selection chamber.

22. A mass analyzer as claimed in claim 16 wherein at least two of said plurality of ion selection chambers share at least one of said plurality of electrodes for generating the non-rotating, oscillating electric field in the respective ion selection chamber.

23. A mass analyzer as claimed in claim 22 wherein said at least two of said plurality of ion selection chambers are disposed immediately adjacent one another.

24. A mass analyzer as claimed in claim 16 wherein at least two of said plurality of ion selection chambers share at least two of said plurality of electrodes for generating the rotating electric field in the respective ion selection chamber.

25. A mass analyzer as claimed in claim 24 wherein said at least two of said plurality of ion selection chambers are disposed immediately adjacent one another.

26. A mass analyzer as claimed in claim 16 wherein the rotating electric fields in adjacent ones of said plurality of ion selection chambers are substantially equal in magnitude.

27. A mass analyzer as claimed in claim 26 wherein the rotating electric fields in adjacent ones of said plurality of ion selection chambers are out of phase with one another by about 180°.

28. A mass analyzer as claimed in claim 16 wherein the rotating electric fields in adjacent ones of said plurality of ion selection chambers are out of phase with one another by about 180°.

29. A mass filter array as claimed in claim 16 comprising:

a first pair of opposed electrodes disposed in a first ion selection chamber of said plurality of ion selection chambers; and a second pair of opposed electrodes disposed in said first ion selection chamber, said second pair of opposed electrodes being angularly displaced with respect to the first pair of opposed electrodes.

30. A mass analyzer as claimed in claim 29 and further comprising a second ion selection chamber of said plurality of ion selection chambers disposed immediately adjacent said first ion selection chamber, at least one electrode of either said first or second pair of opposed electrodes being shared with said second ion selection chamber.

31. A mass analyzer as claimed in claim 30 wherein said second ion selection chamber comprises:

a third pair of opposed electrodes;

a fourth pair of opposed electrodes that are angularly displaced with respect to the third pair of opposed electrodes; and at least one electrode of either said third or fourth pair of opposed electrodes constituting at least one electrode of either said first or second pair of electrodes.

32. A mass analyzer as claimed in claim 30 wherein said RF signal generator includes first and second terminals of opposite polarity, said first and third pairs of opposed electrodes being connected to said first terminal and said second and fourth pairs of opposed electrodes being connected to said second terminal.

33. A mass analyzer as claimed in claim 30 wherein the electrode surfaces of said first and second pair of opposed electrodes are concave.

34. A mass analyzer as claimed in claim 30 wherein the electrode surfaces of said first and second pair of opposed electrodes are planar.

35. A mass analyzer as claimed in claim 29 wherein the electrode surfaces of said first and second pair of opposed electrodes are concave.

36. A mass analyzer as claimed in claim 29 wherein the electrode surfaces of said first and second pair of opposed electrodes are planar.

37. A mass analyzer as claimed in claim 16 wherein at least one of said plurality of ion injectors comprises an ionizer adapted to receive a sample substance from a liquid chromatography apparatus, said sample substance comprising at least one analyte for ionization.

38. A mass analyzer as claimed in claim 16 wherein at least one of said plurality of ion injectors comprises an ionizer adapted to receive a sample substance from an electrophoresis apparatus, said sample substance comprising at least one analyte for ionization.

39. A mass analyzer as claimed in claim 16 wherein at least one of said plurality of ion injectors comprises an electrospray device.

40. A mass analyzer as claimed in claim 16 wherein at least one of said plurality of ion injectors comprises an ionizer that is adapted to receive a sample material from a direct insertion probe, said sample material comprising an analyte for ionization.

41. A mass analyzer as claimed in claim 16 wherein at least one of said plurality of ion injectors comprises an ionizer that is adapted to receive a sample material from a capillary column, said sample material comprising an analyte for ionization.

42. A mass analyzer as claimed in claim 16 wherein at least one of said plurality of ion injectors comprises an ionizer that is adapted to generate ions of an analyte using a matrix-assisted laser desorption/ionization process.

43. A mass analyzer as claimed in claim 16 wherein at least one of said plurality of ion injectors comprises an ionizer that is adapted to generate ions of an analyte using an electrospray process.

44. A mass analyzer as claimed in claim 16 and further comprising a plurality of ion detection surfaces proximate respective ion outlets of each of said plurality of ion selection chambers, each of said plurality of ion detection surfaces being positioned to primarily detect ions exiting substantially at a predetermined exit angle with reference to the outlet plane of the respective ion selection chamber to the general exclusion of ions having other exit angles.

45. A mass filter comprising:

a first pair of opposed electrodes, each electrode of said first pair having a concave electrode surface, said concave electrode surfaces of said first pair of opposed electrodes facing one another;

a second pair of opposed electrodes, each electrode of said second pair having a concave electrode surface, said concave electrode surfaces of said second pair of opposed electrodes facing one another and being angularly displaced with respect to said concave electrode surfaces of said first pair of opposed electrodes; and an RF signal generator having a first terminal connected to said first pair of opposed electrodes and a second terminal connected to said second pair of opposed electrodes to thereby generate a rotating electric field between said concave electrode surfaces.

46. A mass analyzer as claimed in claim 45 wherein at least one electrode of either said first or pair of opposed electrodes comprises at least two conductive exterior surfaces separated by a dielectric core.

47. A mass analyzer as claimed in claim 45 wherein said concave electrode surfaces of said first pair of opposed electrodes and said concave electrode surfaces of said second pair opposed electrodes are angularly displaced from one another by about 90 degrees.

* * * * *

UNITED STATES PATENT AND TRADEMARK OFFICE

CERTIFICATE OF CORRECTION

PATENT NO. : 6,791,077 B1
DATED : September 14, 2004
INVENTOR(S) : Vincent R. Farnsworth It is certified that error appears in the above-identified patent and that said Letters Patent is hereby corrected as shown below:

Title page,
Item [57], ABSTRACT,
Line 10 , cancel "non-rotating, oscillating" and substitute -- rotating -- therefor.

Signed and Sealed this

Twenty-ninth Day of March, 2005

JON W. DUDAS
*Director of the United States Patent and Trademark Office*